United States Patent
Yu et al.

(10) Patent No.: US 9,111,949 B2
(45) Date of Patent: Aug. 18, 2015

(54) METHODS AND APPARATUS OF WAFER LEVEL PACKAGE FOR HETEROGENEOUS INTEGRATION TECHNOLOGY

(75) Inventors: Chen-Hua Yu, Hsin-Chu (TW); Der-Chyang Yeh, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/536,549

(22) Filed: Jun. 28, 2012

(65) Prior Publication Data
US 2013/0264684 A1    Oct. 10, 2013

Related U.S. Application Data
(60) Provisional application No. 61/621,884, filed on Apr. 9, 2012.

(51) Int. Cl.
*H01L 23/48* (2006.01)
*H01L 21/60* (2006.01)
(Continued)

(52) U.S. Cl.
CPC ........ *H01L 21/561* (2013.01); *H01L 23/49816* (2013.01); *H01L 23/49894* (2013.01); *H01L 23/5389* (2013.01); *H01L 24/19* (2013.01); *H01L 24/20* (2013.01); *H01L 24/24* (2013.01); *H01L 24/82* (2013.01); *H01L 25/0655* (2013.01); *H01L 25/16* (2013.01); *H01L 25/50* (2013.01); *H01L 21/568* (2013.01); *H01L 21/6835* (2013.01); *H01L 23/3128* (2013.01); *H01L 23/64* (2013.01); *H01L 24/05* (2013.01); *H01L 24/13* (2013.01); *H01L 25/18* (2013.01); *H01L 2221/68327* (2013.01); *H01L 2224/0401* (2013.01); *H01L 2224/04105* (2013.01); *H01L 2224/05147* (2013.01); *H01L 2224/05572* (2013.01); *H01L 2224/05655* (2013.01); *H01L 2224/12105* (2013.01); *H01L 2224/131* (2013.01); *H01L 2224/13147* (2013.01); *H01L 2224/2101* (2013.01); *H01L 2224/244* (2013.01);
(Continued)

(58) Field of Classification Search
CPC ................. H01L 23/49816; H01L 23/5389
USPC ........................... 257/616, 700, 733
See application file for complete search history.

(56) References Cited

U.S. PATENT DOCUMENTS 6,396,153 B2 * 5/2002 Fillion et al. .................. 257/774
7,667,318 B2 * 2/2010 Yang et al. .................... 257/700
(Continued)

FOREIGN PATENT DOCUMENTS

DE       10238816 A1     3/2004
DE   102007063301 A1     7/2008
(Continued)

*Primary Examiner* — Kimberly Rizkallah
*Assistant Examiner* — Mounir Amer
(74) *Attorney, Agent, or Firm* — Slater & Matsil, L.L.P.

(57) ABSTRACT

Methods and apparatus are disclosed to form a WLP device that comprises a first chip made of a first technology, and a second chip made of a second technology different from the first technology packaged together by a molding material encapsulating the first chip and the second chip. A post passivation interconnect (PPI) line may be formed on the molding material connected to a first contact pad of the first chip by a first connection, and connected to a second contact pad of the second chip by a second connection, wherein the first connection and the second connection may be a Cu ball, a Cu via, a Cu stud, or other kinds of connections.

20 Claims, 16 Drawing Sheets

(51) Int. Cl.
*H01L 21/56* (2006.01)
*H01L 23/00* (2006.01)
*H01L 23/498* (2006.01)
*H01L 23/538* (2006.01)
*H01L 25/065* (2006.01)
*H01L 25/16* (2006.01)
*H01L 25/00* (2006.01)
*H01L 23/31* (2006.01)
*H01L 21/683* (2006.01)
*H01L 23/64* (2006.01)
*H01L 25/18* (2006.01)

(52) U.S. Cl.
CPC . *H01L 2224/245* (2013.01); *H01L 2224/24011* (2013.01); *H01L 2224/24101* (2013.01); *H01L 2224/24137* (2013.01); *H01L 2224/73267* (2013.01); *H01L 2224/82005* (2013.01); *H01L 2224/82101* (2013.01); *H01L 2924/00014* (2013.01); *H01L 2924/1305* (2013.01); *H01L 2924/1461* (2013.01)

(56) References Cited

U.S. PATENT DOCUMENTS

| | | |
|---|---|---|
| 2005/0250304 A1 | 11/2005 | Hedler et al. |
| 2008/0108168 A1* | 5/2008 | Yang et al. ............... 438/64 |
| 2008/0153245 A1 | 6/2008 | Lin et al. |
| 2008/0157341 A1 | 7/2008 | Yang et al. |
| 2009/0020864 A1* | 1/2009 | Pu et al. ............... 257/687 |
| 2010/0181642 A1* | 7/2010 | Sarfaraz et al. ............... 257/528 |
| 2010/0258937 A1* | 10/2010 | Shim et al. ............... 257/692 |
| 2011/0068461 A1* | 3/2011 | England ............... 257/700 |
| 2011/0084382 A1* | 4/2011 | Chen et al. ............... 257/737 |
| 2011/0272779 A1* | 11/2011 | Kim et al. ............... 257/529 |

FOREIGN PATENT DOCUMENTS

| | | |
|---|---|---|
| EP | 1727192 A1 | 11/2006 |
| KR | 20060034716 A | 4/2006 |
| KR | 20090057089 A | 6/2009 |
| WO | 2005013339 A2 | 2/2005 |
| WO | 2008028851 A1 | 3/2008 |

\* cited by examiner

METHODS AND APPARATUS OF WAFER LEVEL PACKAGE FOR HETEROGENEOUS INTEGRATION TECHNOLOGY

This application claims the benefit of U.S. Provisional Application No. 61/621,884, filed on Apr. 9, 2012, entitled "Methods and Apparatus of Wafer Level Package for Heterogeneous Integration Technology."

BACKGROUND

Semiconductor devices are used in a variety of electronic applications, such as personal computers, cell phones, digital cameras, and other electronic equipments. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller package for semiconductor devices that has been developed is the wafer level package (WLP). A wafer-level package of integrated circuits (ICs) made of heterogeneous technologies, which may be referred as a heterogeneous integration, reduces manufacturing cost, while providing high performance and high density. Initial applications of heterogeneous integration, also referred to as hyper-integration, have been on microprocessors, application specific integrated circuits (ASICs), and memories. Other applications of heterogeneous integration are being explored for radio frequency (RF), analog, optical, and micro-electro-mechanical systems (MEMS), where integration of ICs made with heterogeneous technologies, such as digital CMOS, SiGe RF BiCMOS, any existing or future technologies can be wafer-level "packaged."

Many existing WLP techniques for heterogeneous integration technologies are based on vertically stacking the ICs. Such techniques may require a larger height which may not be available in certain situations. Therefore there is a need to develop other forms of WLP techniques for heterogeneous integration technologies.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Wafer level packages (WLP) are commonly used for integrated circuits (ICs) demanding high speed, high density, and greater pin count. A WLP style semiconductor device involves mounting an active area of a die toward a chip carrier substrate or a printed circuit board (PCB). The electrical and mechanical interconnect is achieved through a plurality of connection devices, or simply called connections, such as conductive solder bumps or balls. The solder bumps are formed on bump pads or interconnect points or contact pads, which are disposed on the active area. A connection may be a solder bump, a solder ball, a Cu stud, a Cu via, or any other like connection device to achieve electrical connection between two objects. Any of those connection devices may be simply referred as a connection. The contact pads are used to mean interconnect points, bump pads, or any other conductive objects that make the connections.

Methods and apparatus are disclosed to form a WLP device that comprises a first chip made of a first technology, and a second chip made of a second technology packaged together by a molding material encapsulating the first chip and the second chip. A post passivation interconnect (PPI) line may be formed on the molding material connected to a first contact pad of the first chip by a first connection, and connected to a second contact pad of the second chip by a second connection, wherein the first connection and the second connection may be a Cu ball, a Cu via, a Cu stud, or other kinds of connections.

Figure 1A:
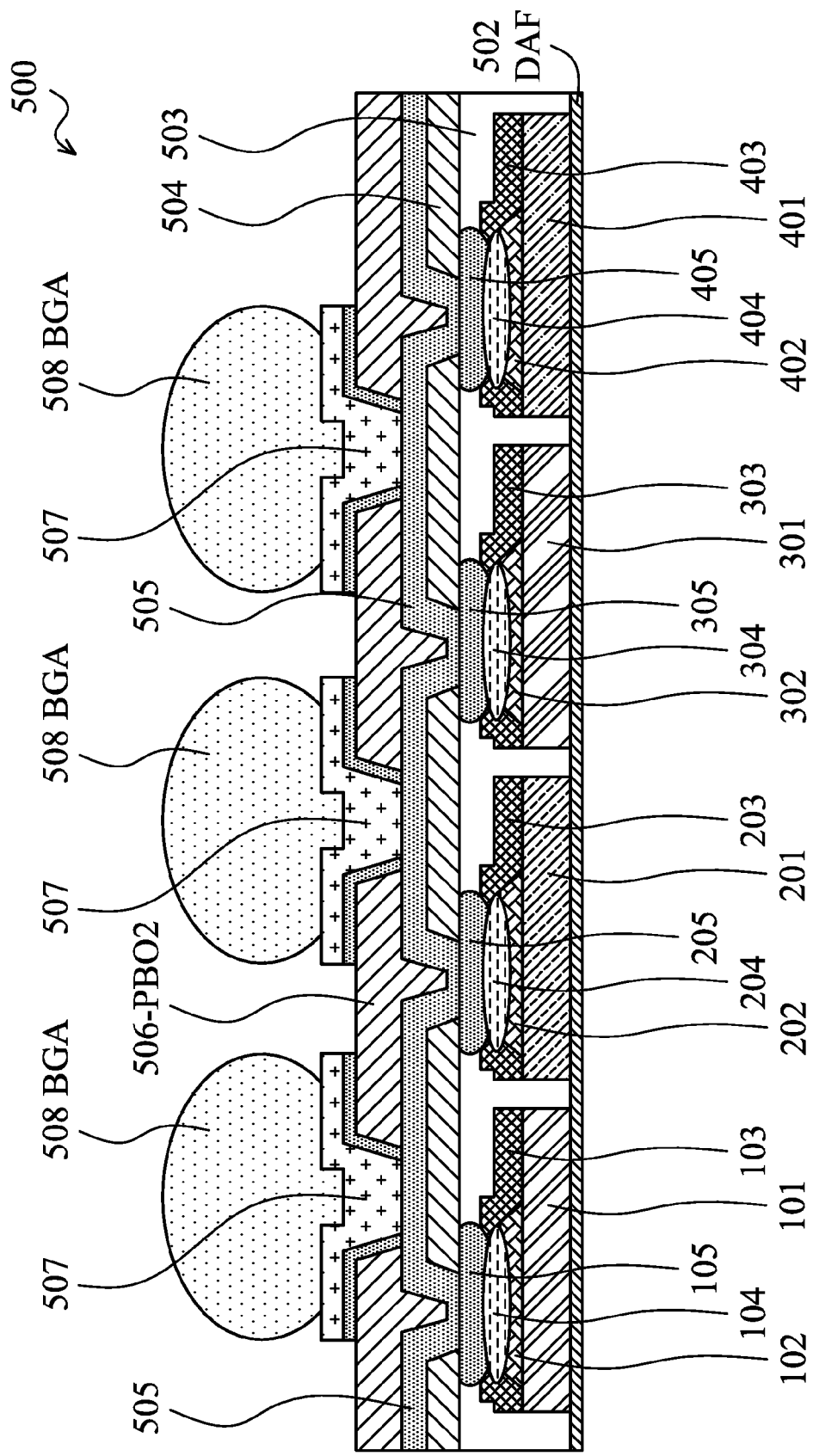
FIGS. 1(a)-1(b) illustrate embodiments of wafer level package (WLP) for integrated circuits (ICs) made of heterogeneous technology.

As illustrated in FIG. 1(a) in a cross-sectional view, an exemplary WLP style semiconductor device 500 of heterogeneous integration technologies comprises a CMOS chip 101, a GaAs chip 201, a SiGe chip 301, and an integrated passive device (IPD) 401. The CMOS chip 101 may be a processor or a memory chip. The GaAs chip 201 may be a power amplifier or an optoelectronic device such as an image sensor. The SiGe chip 301 may be a BiCMOS pipelined A/D converter. The IPD 401 may be an integrated passive circuit comprising resistors, inductors, and capacitors. The device 500 may be an intelligent wireless terminal integrating processors, large memory, image sensors, and RF/microwave transceivers in a WLP device.

The number of chips with heterogeneous technologies is only for illustration purposes and is not limiting. A WLP device 500 of heterogeneous integration technologies may comprise a first chip made of a first technology and a second chip made of a second technology, or any other combinations. The term technology for a chip may mean the size of the transistor of the chip, the size of the wafer used to manufacture the chip, the differences on the transistors, or any other terms used in the art. Therefore a CMOS chip, a GaAs chip, a SiGe chip, and an IPD are all made with different technologies.

Although not illustrated in FIG. 1(a), the CMOS chip 101 may contain active and passive devices, conductive layers, and dielectric layers, formed on a substrate, which may be a bulk silicon substrate or a silicon-on-insulator substrate. Other semiconductor materials including group III, group IV, and group V elements may also be used for the substrate. The GaAs chip 201 may comprise npn bipolar transistors on a semi-insulating GaAs substrate. The SiGe chip 301 may comprise SiGe heterojunction bipolar transistors (HBT) containing germanium (Ge) as a base. SiGe Bi-CMOS technology may be a suitable technology for fabricating a system of radio frequency (RF)/analogue/digital among various wireless mobile communication components. The IPD 401 may be an integrated passive circuit comprising resistors, inductors, and capacitors.

FIG. 1(*a*) illustrates a contact pad 102 on the chip 101, a contact pad 202 on the chip 201, a contact pad 302 on the chip 301, and a contact pad 402 on the chip 401, which are all connected to one or a plurality of solder ball/bump 508. Those contact pads 102, 202, 302, and 402 are electronically connected to each other as well. The chips 101, 201, 301, and 401 may comprise a plurality of contact pads connected to a plurality of solder ball/bumps, which are not shown in FIG. 1(*a*). A conductive layer is formed as the contact pad 102 on a surface of the CMOS chip 101. Other contact pads 202, 302, and 402 are formed similarly. The contact pads 102, 202, 302, and 402 may be called conductive pads. The contact pads 102, 202, 302, and 402 may be made with aluminum (Al), copper (Cu), tin (Sn), nickel (Ni), gold (Au), silver (Ag), or other electrically conductive material. The deposition of the contact pads 102, 202, 302, and 402 uses an electrolytic plating, sputtering, PVD, or electroless plating process. The size, shape, and location of the contact pads 102, 202, 302, and 402 are only for illustration purposes and are not limiting. In general, a first contact pad may be on a first chip made of a first technology, and a second contact pad may be on a second chip made of a second technology. Those contact pads may be electronically connected to each other as well. The plurality of contact pads, which are not shown, may be of the same size or of different sizes.

A passivation layer 103 may be formed over the surface of the CMOS chip 101 and on top of the contact pad 102 for structural support and physical isolation. The passivation layer 103 may be made with un-doped silicate glass (USG), silicon nitride (SiN), silicon dioxide (SiO2), silicon oxynitride (SiON), polyimide (PI), benzocyclobutene (BCB), polybenzoxazole (PBO), or other insulating material. An opening of the passivation layer 103 is made by removing a portion of the passivation layer 103 using a mask-defined photoresist etching process to expose the contact pad 102. The size, shape, and location of the opening made are only for illustration purposes and are not limiting. Similarly the passivation layer 203, 303, and 403 are formed on the chips 201, 301, and 401, respectively, for structural support and physical isolation, with similar material as for the passivation layer 103, with openings to expose the contact pads 202, 302, and 402, respectively. In general, a first passivation layer may be on the first contact pad on a first chip made of a first technology, and a second passivation layer may be on the second contact pad on a second chip made of a second technology.

A highly accurate stenciling machine may be used to deposit a discrete block of solder paste 104 onto the contact pad 102. The solder paste 104 deposited on the contact pad 102 forms a small solder paste brick 104. Similar solder paste bricks 204, 304, and 404 may be formed in a same fashion on the contact pads 202, 302, and 402, respectively. After forming the solder paste brick 104 on the contact pad 102, and the other solder paste bricks 204, 304, and 404, the device 500 may be transferred to a reflow oven, and be heated in the oven to reflow the solder (i.e., to vaporize the flux and form solder balls from the solder paste bricks). The reflow process creates both a mechanical and electrical connection between the solder ball 105 and the corresponding contact pad 102 after the reflowed solder 105 has cooled and solidified. Similar solder balls 205, 305, and 405 may be formed for the chips 201, 301, and 401.

The chips 101, 201, 301, and 401 made of heterogeneous technologies may be packaged together horizontally using a molding material 503 by a molding process. The chips 101, 201, 301, and 401, with its contact pads 102, 202, 302, and 402 connected to the solder balls 105, 205, 305, and 405, together with its respective passivation layers 103, 203, 303, and 403, respectively, are molded together horizontally using a molding resin such as, for example, an epoxy molding compound (EMC). The molding process may be referred to as an encapsulation process. The molding material 503 encapsulates the chips 101, 201, 301, and 401 together into one physical piece. The molding material 503 is in contact with a layer of die attach film (DAF) 502. A carrier substrate may have been used under the DAF 502 to support the molding operation, which is now removed from the structure shown in FIG. 1(*a*).

A polymer layer 504 may be formed on the molding material 503. The polymer layer 504 may be patterned to form openings to expose the solder balls 105, 205, 305, and 405. The patterning of the polymer layer 504 may include photolithography techniques. The polymer layer 504 may be formed of a polymer, such as an epoxy, polyimide, benzocyclobutene (BCB), polybenzoxazole (PBO), and the like, although other relatively soft, often organic, dielectric materials can also be used. The preferred formation methods include spin coating or other commonly used methods. The thickness of the polymer layer 504 may be between about 5 µm and about 30 µm. The dimensions recited throughout the description are merely examples, and will change with the down-scaling of integrated circuits.

A metal material is used to form a post passivation interconnect (PPI) line 505 on the polymer layer 504, following the contour of the polymer layer 504. The PPI line 505 also fills the openings of the polymer layer 504, and in contact with the solder balls 105, 205, 305, and 405. Therefore the PPI line 505 forms an electrical connection between the solder balls 105, 205, 305, and 405, which further connect the contact pads 102, 202, 302, and 402, respectively. The PPI line 505 has a thickness of less than about 30 µm, and more preferably between about 2 µm and about 10 µm. The PPI line 505 may further include a nickel-containing layer (not shown) on the top of copper layer. The formation methods include plating, electroless plating, sputtering, chemical vapor deposition methods, and the like.

A second polymer layer 506 may be formed on the PPI line 505. The second polymer layer 506 may be patterned to form openings where the solder balls 508 will be placed. The patterning of polymer layer 506 may include photolithography techniques. The polymer layer 506 may be formed of a polymer, such as an epoxy, polyimide, benzocyclobutene (BCB), polybenzoxazole (PBO), and the like, although other relatively soft, often organic, dielectric materials can also be used. The preferred formation methods include spin coating or other commonly used methods.

An under bump metal (UBM) layer 507 may be formed around the openings of the second polymer layer 506. The UBM layer 507 may be formed of copper or copper alloys, which may include silver, chromium, nickel, tin, gold, and combinations thereof. Additional layers, such as a nickel layer, a lead-free pre-solder layer, or the combinations thereof, may be formed over the copper layer. The UBM layer 507 may have a thickness of between about 1 µm and about 20 µm.

The solder balls 508 may be mounted on UBM 507. As is commonly known in the art, the solder ball 508 may include the alloys of tin, lead, silver, copper, nickel, bismuth, and the like. Alternatively, a copper bump instead of solder ball 508 may be formed on UBM 507 by, for example, plating, print, and the like.

The connection between a solder ball 508 and a contact pad 102 for the first chip 101 is made through the UBM layer 507, the PPI line 505, the solder ball 105, to the contact pad 102 on top of the first chip 101. The connection between a solder ball 508 and a contact pad 202, 302, and 402 are formed similarly. The chips 101, 201, 301, and 401, of heterogeneous technologies are therefore packaged together and electronically connected to each other and to solder balls 508, which may be further mounted to a printed circuit board (PCB), not shown.

Figure 1B:
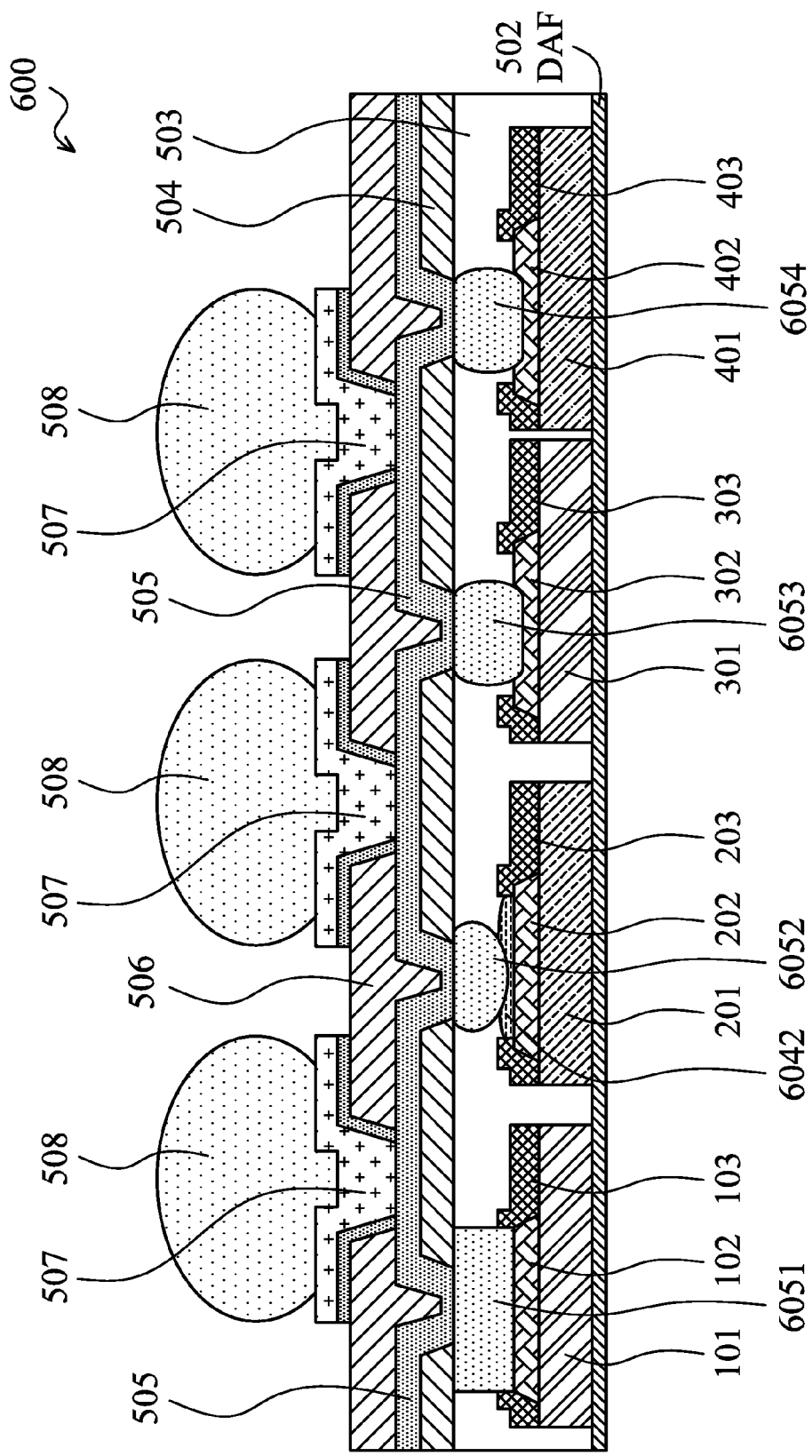

The chips 101, 201, 301, and 401, of heterogeneous technologies may be packaged together and electrically connected to each other and connected to solder balls by different means. The device 600 in FIG. 1(b) is another exemplary embodiment showing different connection mechanisms between a contact pad 102, 202, 302, and 402 and a solder ball 508. Except the differences in the connection mechanisms, the other parts of FIG. 1(b) are essentially the same as they are illustrated in FIG. 1(a).

As illustrated in FIG. 1(b), the connection for the first contact pad 102 of the first chip 101 to a solder ball 508 is made through the contact pad 102, a Cu via 6051, to the PPI line 505, which is further connected to the UBM layer 507 where the solder ball 508 is located. The Cu via 6051 is the connection or the connection device that connects the contact pad 102 to the PPI line 505. The PPI line 505 is further in contact with the UBM layer 507 where the solder ball 508 is located.

The connection for the second contact pad 202 on the second chip 201 to a solder ball 508 is made in a different way. The second contact pad 202 is connected to a solder paste brick 6042 with a solder ball 6052 formed on it by a reflowing process. The solder ball 6052 is further connected to the PPI line 505, connected the UBM layer 507 where the solder ball 508 is located. The solder ball 6052 is the connection or the connection device that connects the contact pad 202 to the PPI line 505. The PPI line 505 is further in contact with the UBM layer 507 where the solder ball 508 is located.

The connection for the third contact pad 302 on the third chip 301 to a solder ball 508 is made in a third way. A Cu stud 6053 is connected to the third contact pad 302 on the third chip 301, which is further connected to the PPI line 505, connected the UBM layer 507 where the solder ball 508 is located. The Cu stud 6053 is the connection or the connection device that connects the contact pad 302 to the PPI line 505. The PPI line 505 is further in contact with the UBM layer 507 where the solder ball 508 is located.

The example shown in FIG. 1(b) has a fourth contact pad 402 connected to a solder ball 508 using a Cu stud 6054 similar to the way that the third contact pad 302 connected to a solder ball 508.

The Cu via 6051, the solder ball 6052, and the Cu stud 6053 are used to connect to the PPI line 505 in FIG. 1(b). In general, the PPI line 505 may be connected to the first contact pad on a first chip by a first connection and connected to the second contact pad on a second chip by a second connection, where the Cu via, the Cu stud, and the solder ball are examples of the connections. The connection can be a via, a stud, a ball, or a bump, made of any conductive materials. The connections may be different for different chips made of different technologies. There may be more other connections used in the art or developed in the future. The connections may be of various kinds of shapes such as a square, a ball, a diamond, or some other kinds of shapes. The connections may be made in different conductive materials, such as copper, alloys of tin, lead, silver, copper, nickel, bismuth, and the like.

The choice of using a Cu via, a solder ball, or a Cu stud as the connection device or the connection may depend on the number of IO pins for the chips. If a chip 101 has a number of IO pins larger than about 100, a Cu via 6051 may be used as the connection to connect to the contact pad 102. If a chip 201 has a number of IO pins in a range about 50 to 100, a solder ball 6052 may be used as the connection to connect the contact pad 202. If a chip 301 has a number of IO pins less than about 50, then a Cu stud may be used as the connection to connect the contact pad 302, as shown in FIG. 1(b).

The connections may have different sizes or different shapes. A Cu via may have a height larger than about 10 um and a width larger than about 30 um. A solder ball or a Cu ball may have a height larger than about 30 um and a width larger than about 70 um. A Cu stud may have a height about 10 um to 20 um and a width larger than about 50 um. A Cu via may be of a square shape. A solder ball or Cu ball may be of a round shape. A Cu stud may be of a round shape as well. The connections may be made in different ways as well. For example, the solder ball or the Cu ball may be made by pre-solder pasting via stencil, followed by reflow, which will be a different process for the Cu via or the Cu stud.

FIGS. 2(a)-2(h) illustrate an embodiment method of a WLP process to assemble a WLP device 500 as shown in FIG. 1(a).

Figure 2A:
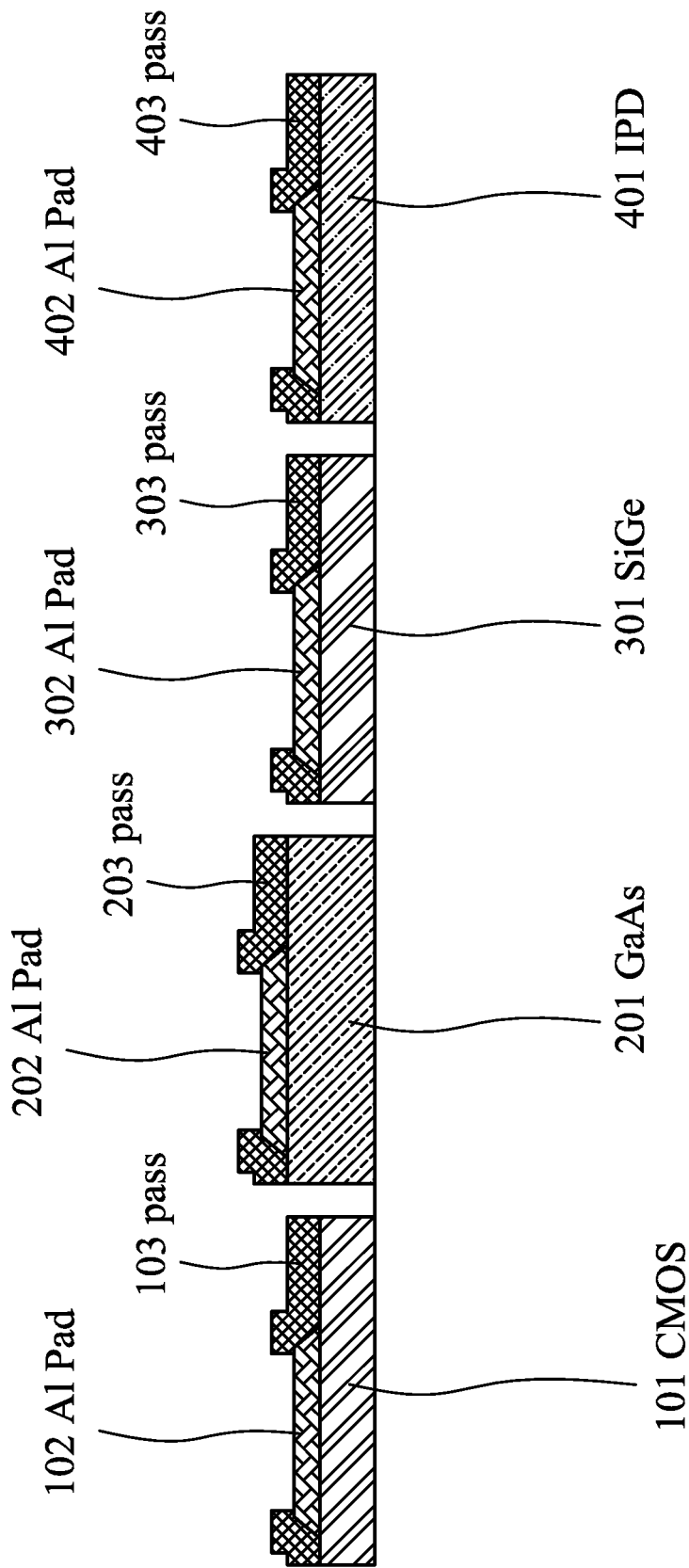
FIGS. 2(a)-2(h) illustrate an embodiment method of a WLP process for integrated circuits (ICs) made of heterogeneous technology.

As illustrated in FIG. 2(a), four chips including a CMOS chip 101, a GaAs chip 201, a SiGe chip 301, and an integrated passive device (IPD) 401 are provided. A contact pad 102 is on the chip 101, a contact pad 202 is on the chip 201, a contact pad 302 is on the chip 301, and a contact pad 402 is on the chip 401. A passivation layer 103 may be formed over the surface of the CMOS chip 101 and on top of the contact pad 102 for structural support and physical isolation. An opening of the passivation layer 103 is made by removing a portion of the passivation layer 103 using a mask-defined photoresist etching process to expose the contact pad 102. Similarly the passivation layer 203, 303, and 403 are formed on the chips 201, 301, and 401, for structural support and physical isolation, with an opening to expose the contact pads 202, 302, and 402, respectively.

Figure 2B:
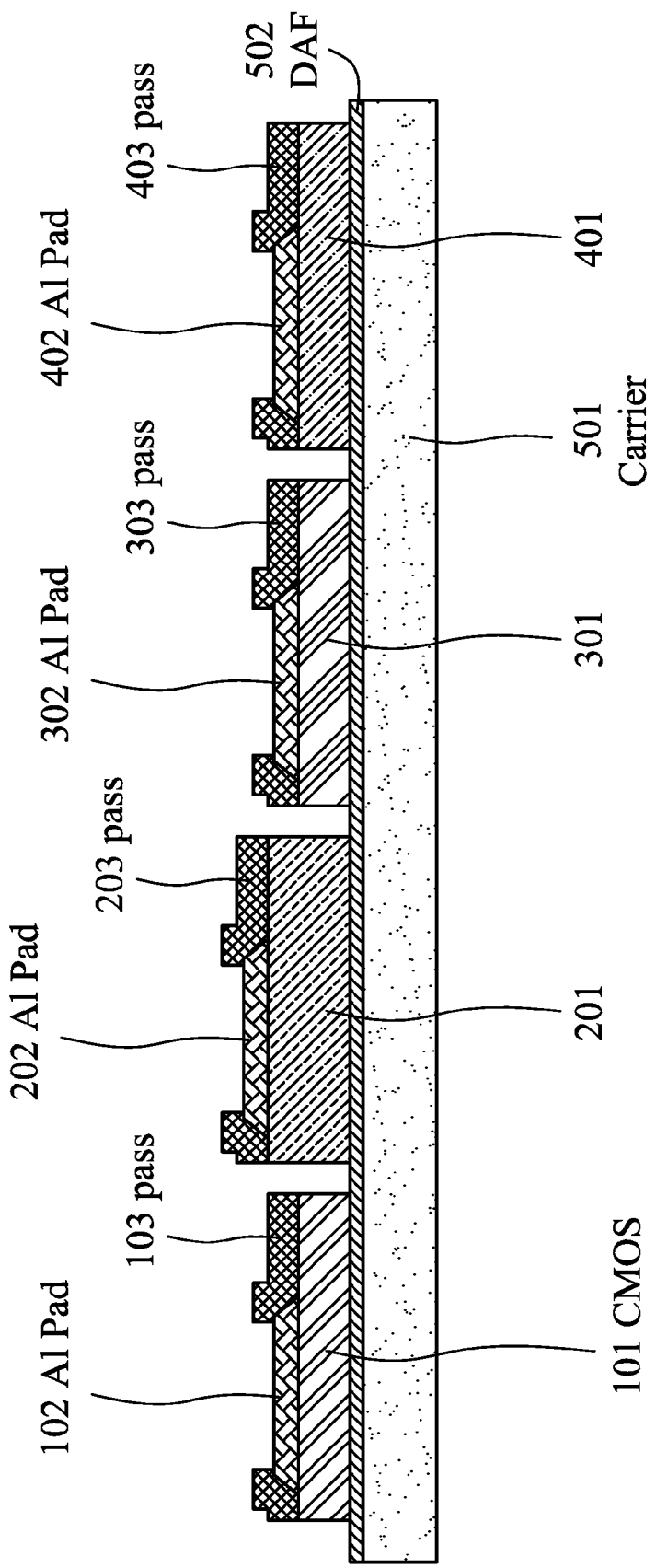

As illustrated in FIG. 2(b), the four chips 101, 201, 301, and 401 are placed on a carrier 501 with a DAF 502 attached. The chips 101, 201, 301, and 401 are spaced apart and placed on a surface of the DAF 502. The carrier 501 is the supporting carrier for the packaging process and will be removed when the packaging is finished.

Figure 2C:
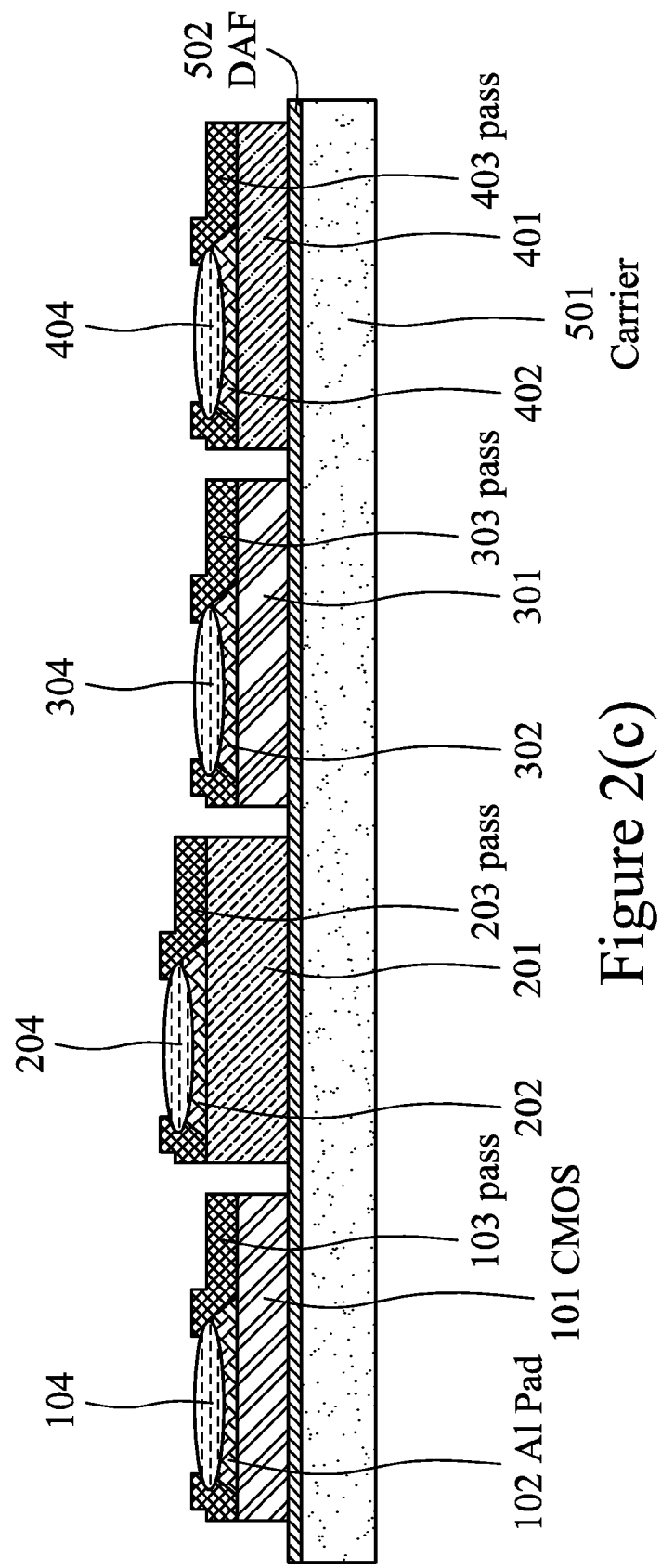

As illustrated in FIG. 2(c), a highly accurate stenciling machine may be used to deposit a discrete block of solder paste 104 onto the contact pad 102. The solder paste 104 deposited on the contact pad 102 forms a small solder paste brick 104. Similar solder paste bricks 204, 304, and 404 may be formed in a same fashion for other chips 201, 301, and 401, respectively.

Figure 2D:
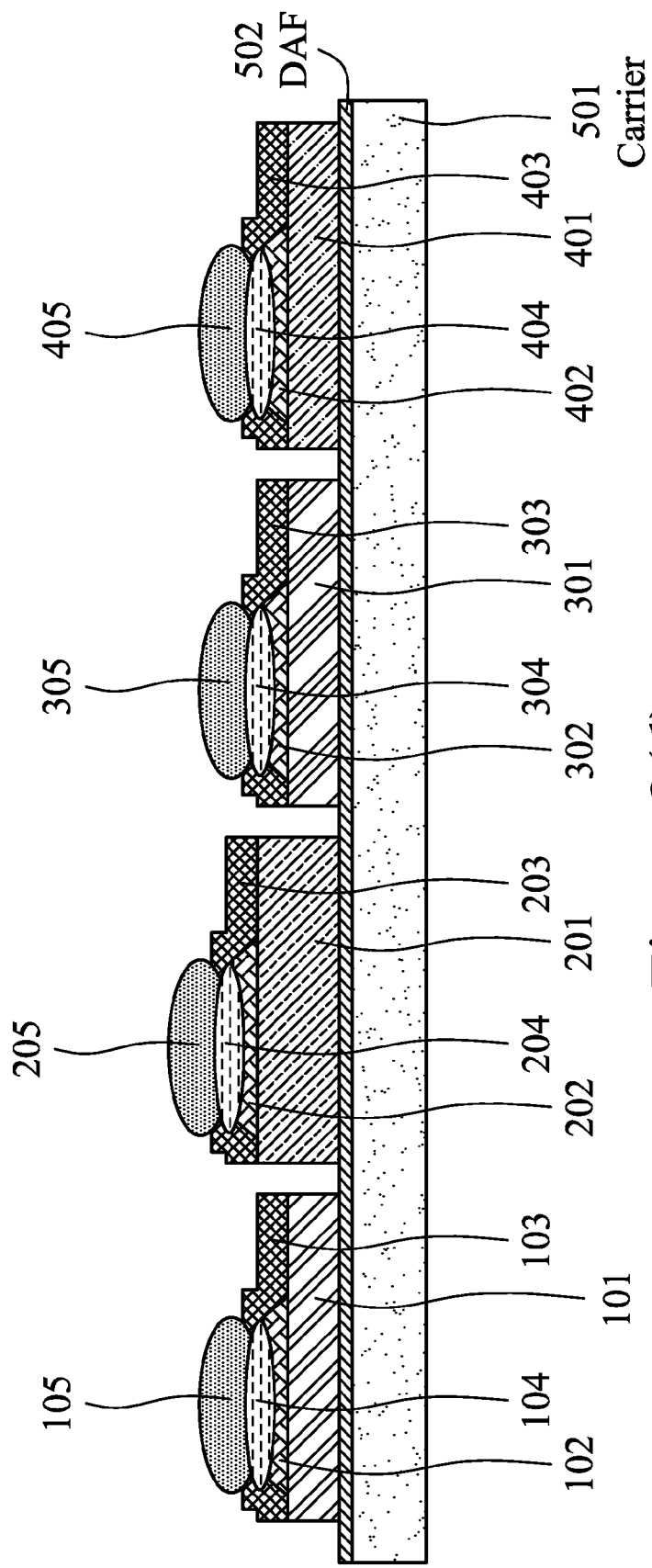

As illustrated in FIG. 2(d), after forming the solder paste brick 104 on the contact pad 102, and the other solder paste bricks 204, 304, and 404, the device 500 may be transferred to a reflow oven, and be heated in the oven to reflow the solder (i.e., to vaporize the flux and form solder balls from the solder paste bricks). The reflow process creates both a mechanical and electrical connection between the solder ball 105 and the corresponding contact pad 102 after the reflowed solder 105 has cooled and solidified. Similar solder balls 205, 305, and 405 may be formed for the chips 201, 301, and 401, respectively.

Figure 2E:
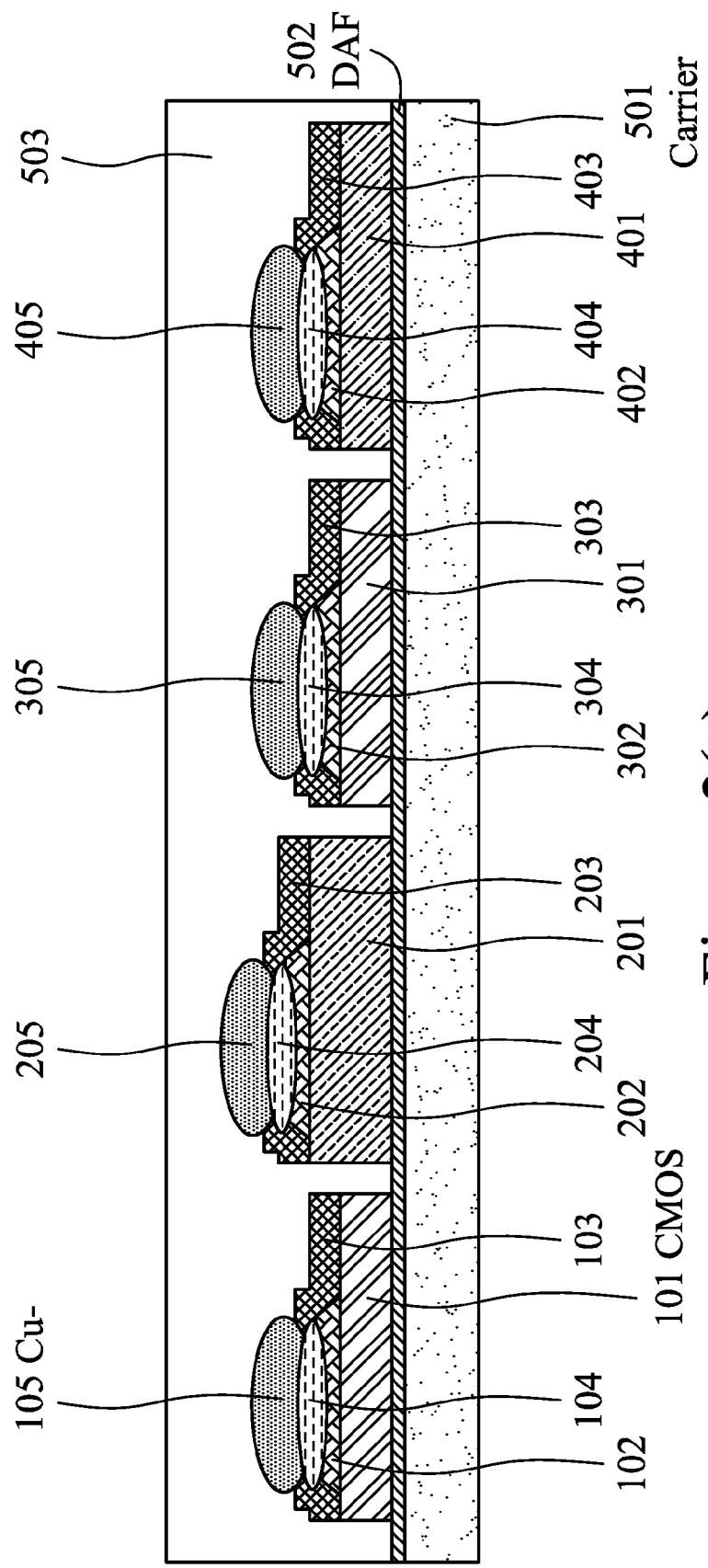

As illustrated in FIG. 2(e), the chips 101, 201, 301, and 401 made of heterogeneous technologies may be packaged together horizontally using a molding material 503 by a molding process. The molding process may be referred to as an encapsulation process. The molding material 503 encapsulates the chips 101, 201, 301, and 401 together into one physical piece. The molding material 503 fills the spaces between pairs of chips, and further covers around each chip.

Figure 2F:
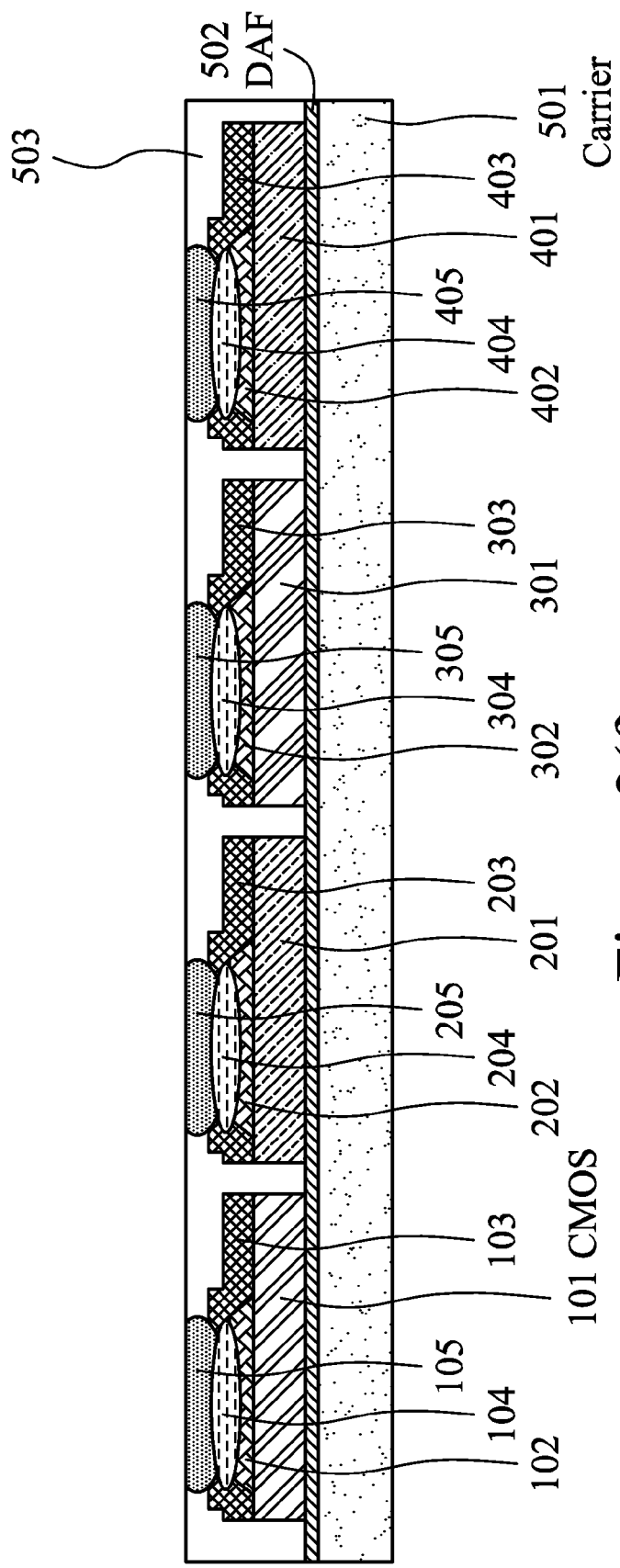

As illustrated in FIG. 2(f), the molding material 503 covering the solder balls 105, 205, 305, and 405 is thinned by grinding to expose the solder balls 105, 205, 305, and 405, which will be used as connections to other layers such as the PPI layer.

Figure 2G:
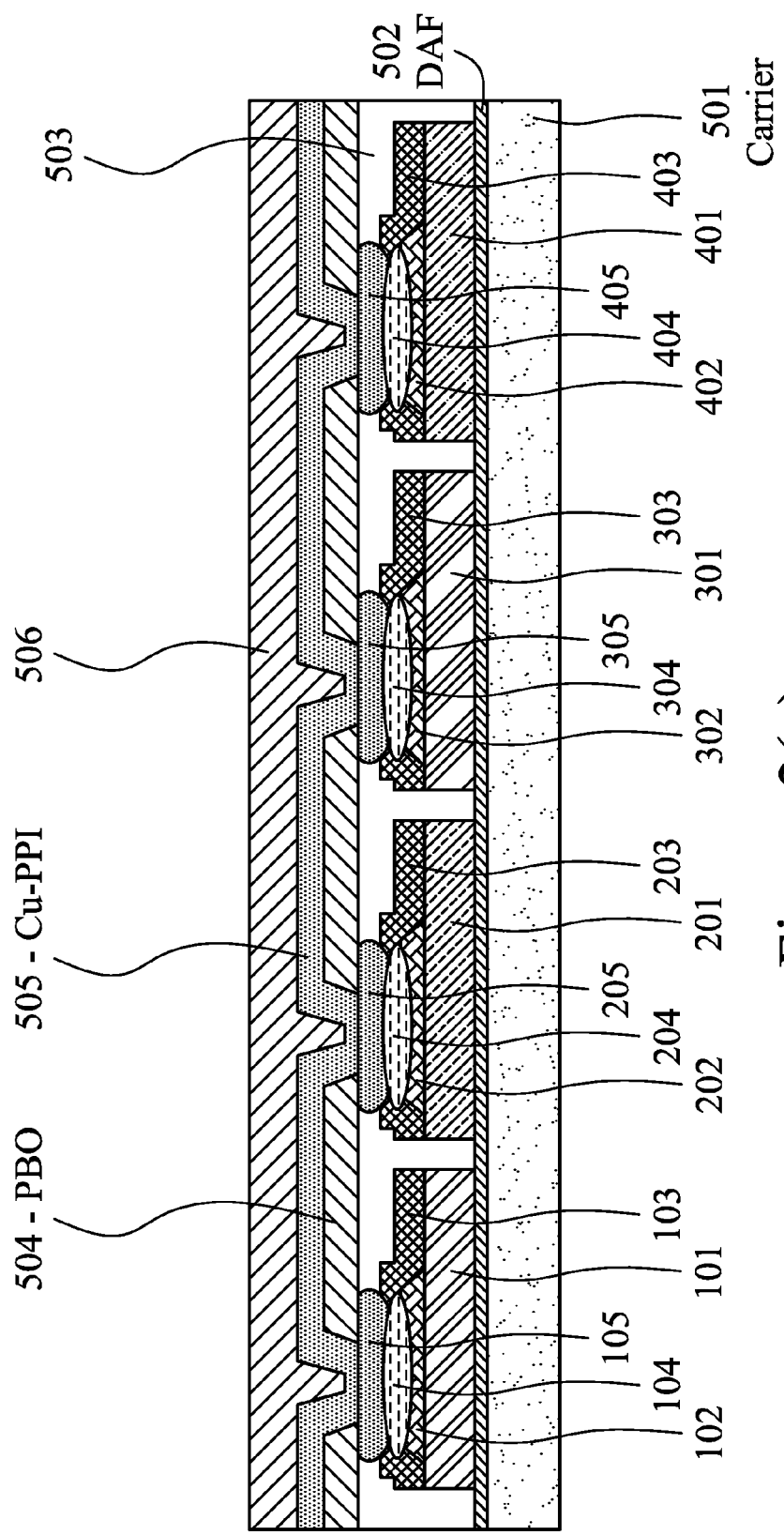

As illustrated in FIG. 2(g), a polymer layer 504 may be formed on the molding material 503. The polymer layer 504 may be patterned to form openings to expose the solder balls 105, 205, 305, and 405. A metal material is used to form a post passivation interconnect (PPI) line 505 on the polymer layer 504, following the contour of the polymer layer 504. The PPI line 505 also fills the openings of the polymer layer 504, and in contact with the solder balls 105, 205, 305, and 405. Therefore the PPI line 505 forms an electrical connection among the solder balls 105, 205, 305, and 405, which further connect the contact pads 102, 202, 302, and 402 respectively. A second polymer layer 506 may be further formed on top of the PPI line 505.

Figure 2H:
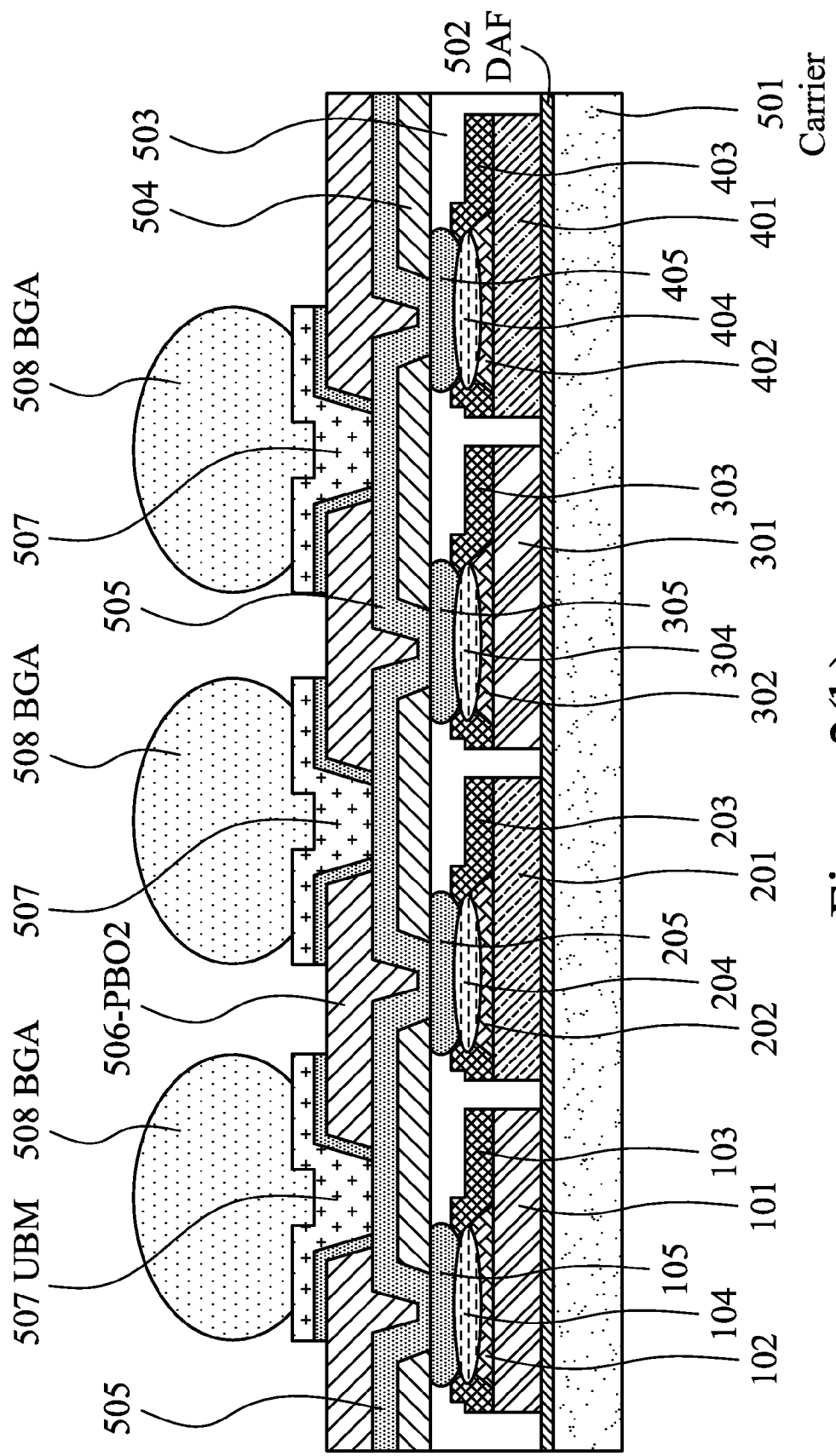

As illustrated in FIG. 2(h), the second polymer layer 506 may be patterned to form openings where the solder balls 508 will be placed. The openings of the second polymer layer 506 may not be directly over the openings of the first polymer layer 504. An under bump metal (UBM) layer 507 may be formed around the openings of the second polymer layer 506. There may be multiple sub-layers for the UBM layer 507. The solder balls 508 may be mounted on the UBM layer 507 in each opening of the second polymer layer 506. The carrier 501 is removed after the four chips 101, 201, 301, and 401 have been packaged and connected to solder balls 508.

FIGS. 3(a)-3(f) illustrate another embodiment method of a WLP process to assemble a WLP device 500 as shown in FIG. 1(b).

Figure 3A:
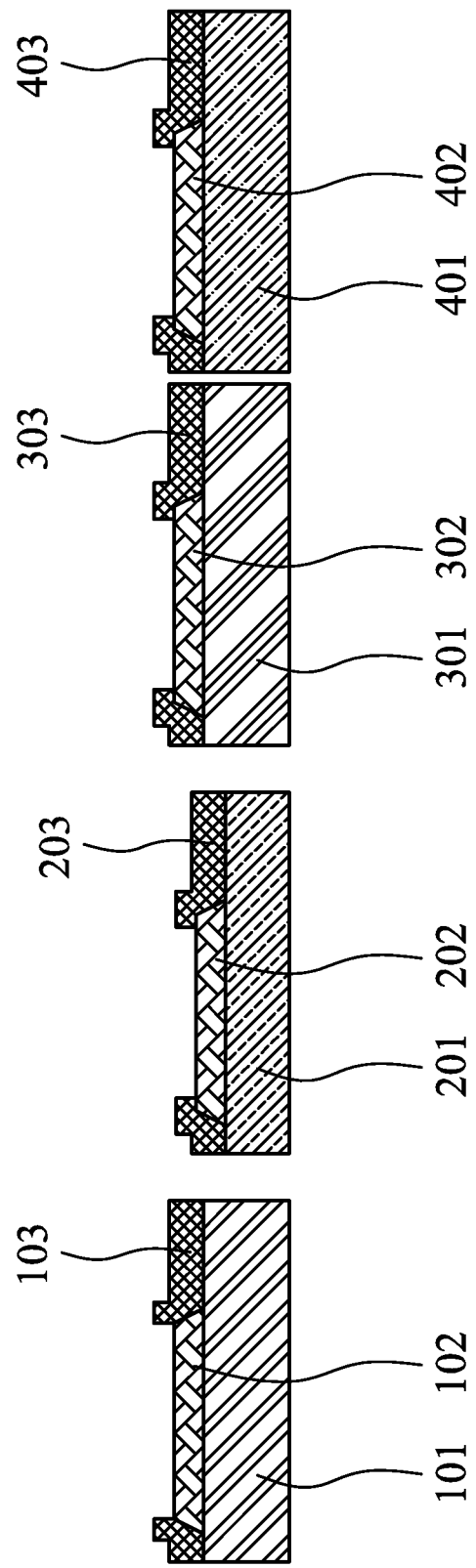
FIGS. 3(a)-3(f) illustrate another embodiment method of a WLP process for integrated circuits (ICs) made of heterogeneous technology.

As illustrated in FIG. 3(a), four chips including a CMOS chip 101, a GaAs chip 201, a SiGe chip 301, and an integrated passive device (IPD) 401 are provided. A contact pad 102 is on the chip 101, a contact pad 202 is on the chip 201, a contact pad 302 is on the chip 301, and a contact pad 402 is on the chip 401. A passivation layer 103 may be formed over the surface of the CMOS chip 101 and on the contact pad 102 for structural support and physical isolation. An opening of the passivation layer 103 is made by removing a portion of the passivation layer 103 to expose the contact pad 102. Similarly the passivation layer 203, 303, and 403 are formed on the chips 201, 301, and 401, for structural support and physical isolation, with an opening to expose the contact pads 202, 302, and 402, respectively.

Figure 3B:
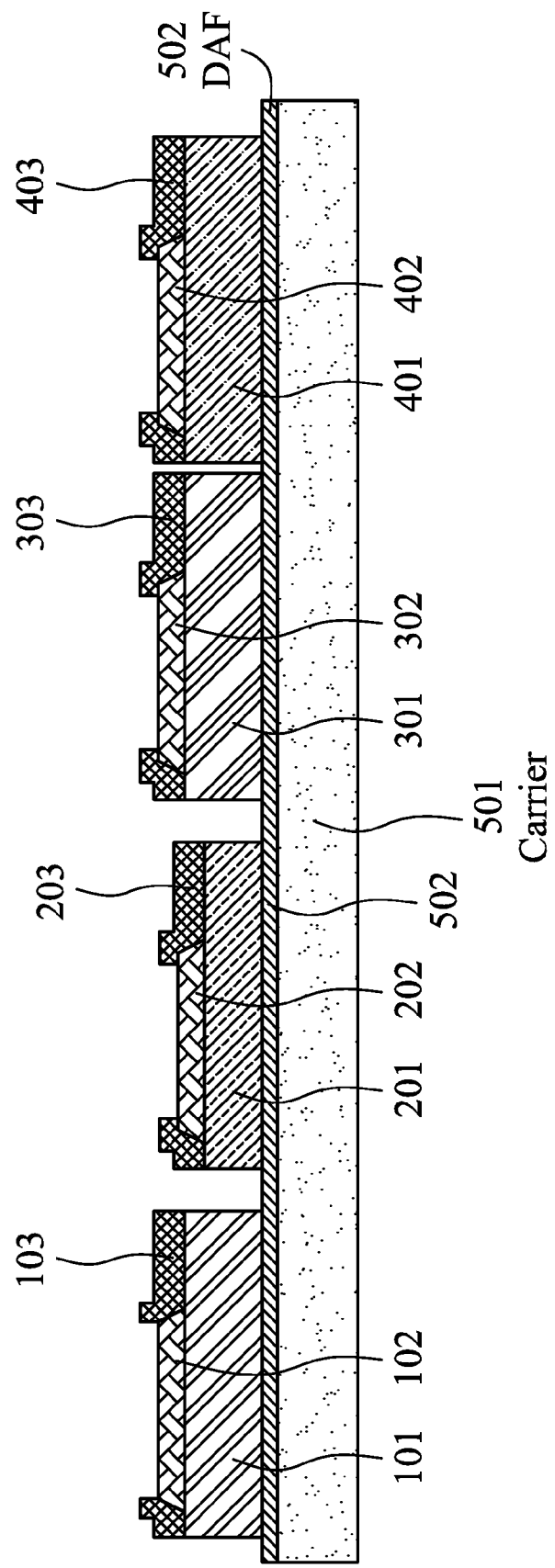

As illustrated in FIG. 3(b), the four chips 101, 201, 301, and 401 are placed on a carrier 501 with a DAF 502 attached. The chips 101, 201, 301, and 401 are spaced apart and placed on a surface of the DAF 502. The carrier 501 is the supporting carrier for the packaging process and will be removed when the packaging is finished.

Figure 3C:
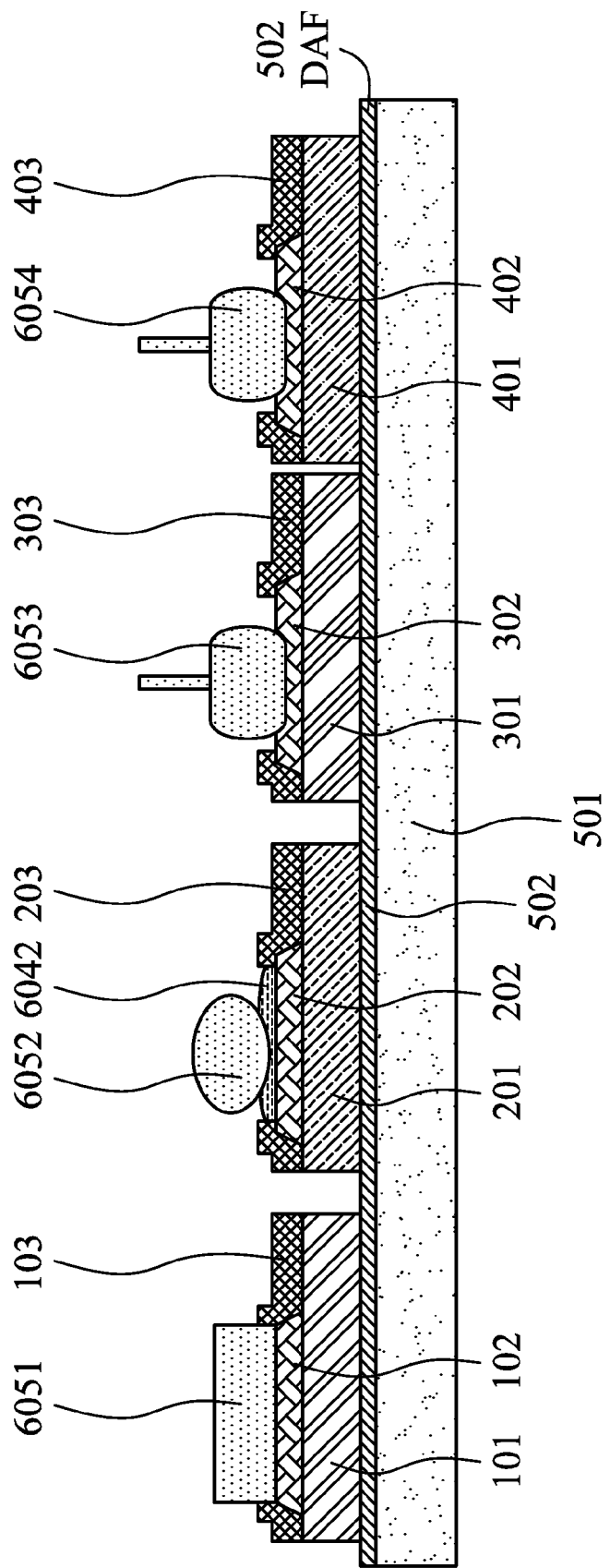

As illustrated in FIG. 3(c), different connections are formed on the chips. A Cu via 6051 is the connection or the connection device formed on the contact pad 102, which will connect the contact pad 102 to a PPI line formed later. A Cu stud 6053 and 6054 is another connection formed on the contact pad 302 and 402, which will connect the contact pad 302 and 402 to a PPI line formed later. The contact pad 202 is connected to a solder paste brick 6042 with a solder ball 6052 formed on it by a reflowing process. The Cu via, the Cu stud, and the solder ball are examples of the connections. There may be more other connections used in the art or developed in the future. The connections may be of various kinds of shapes such as a square, a ball, a diamond, or some other kinds of shapes. The connections may be made in different conductive materials, such as copper, alloys of tin, lead, silver, copper, nickel, bismuth, and the like.

Figure 3D:
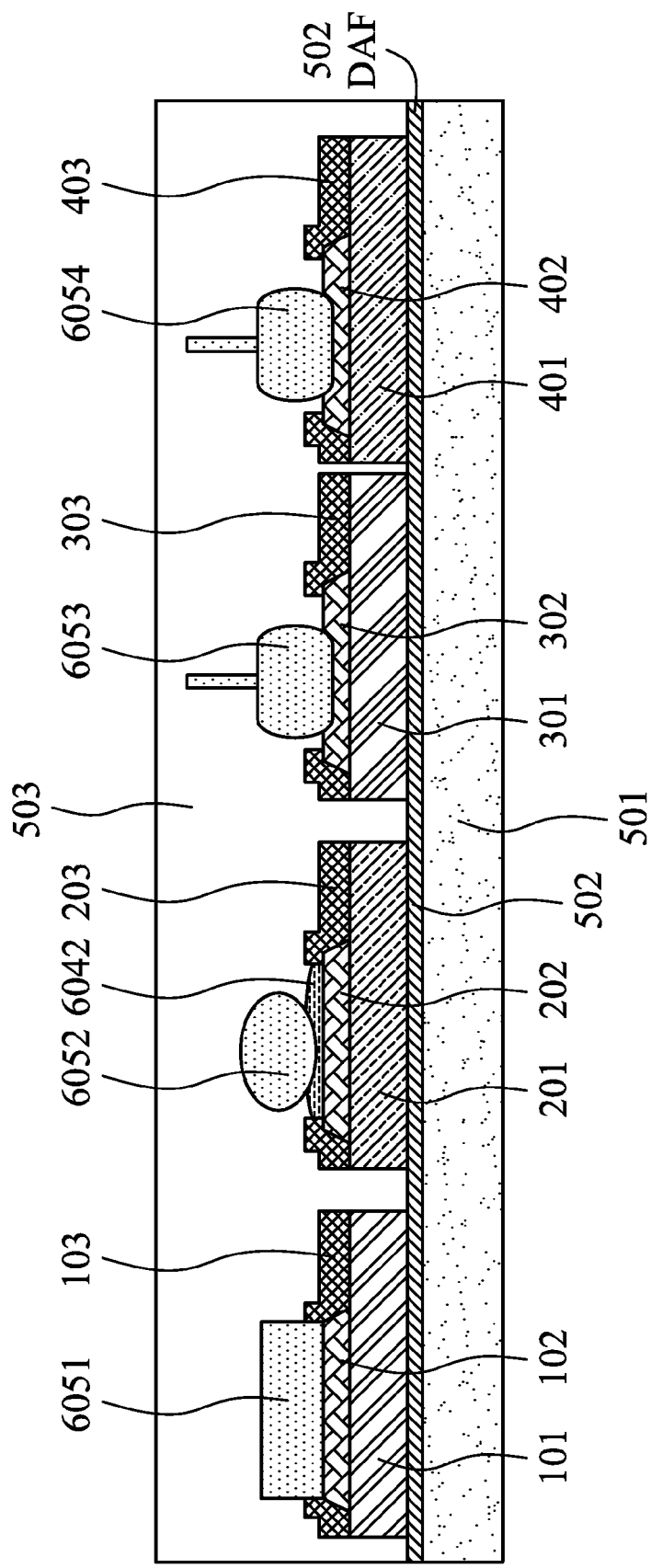

As illustrated in FIG. 3(d), the chips 101, 201, 301, and 401 made of heterogeneous technologies may be packaged together horizontally using a molding material 503 by a molding process. The molding process may be referred to as an encapsulation process. The molding material 503 encapsulates the chips 101, 201, 301, and 401 together into one physical piece. The molding material 503 fills the spaces between pairs of chips, and further covers around each chip.

Figure 3E:
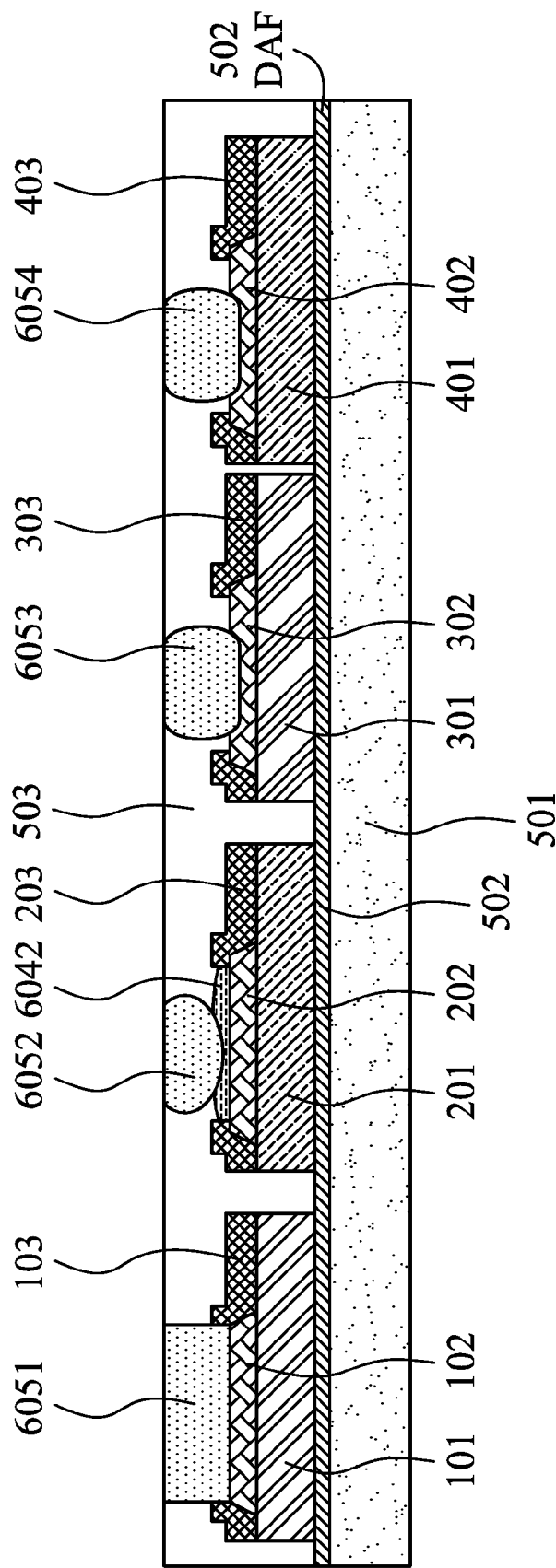

As illustrated in FIG. 3(e), the molding material 503 covering the connections 6051, 6052, 6053, and 6054 is thinned by grinding to expose the connections 6051, 6052, 6053, and 6054, which will be used as connections to other layers such as the PPI layer.

Figure 3F:
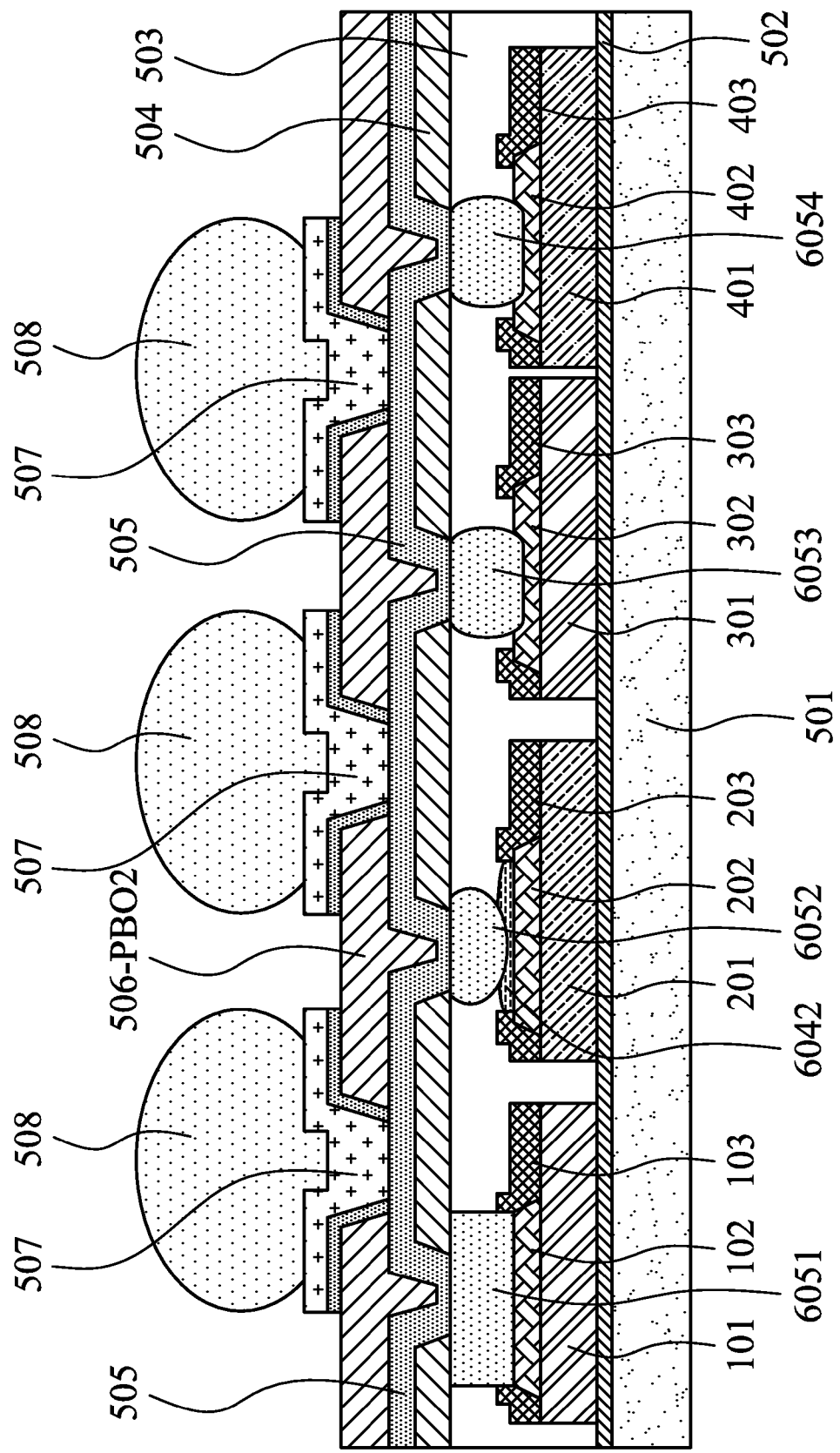

As illustrated in FIG. 3(f), a polymer layer 504 may be formed on the molding material 503. The polymer layer 504 may be patterned to form openings to expose the connections 6051, 6052, 6053, and 6054. A metal material is used to form a post passivation interconnect (PPI) line 505 on the polymer layer 504, following the contour of the polymer layer 504. The PPI line 505 also fills the openings of the polymer layer 504, and in contact with the connections 6051, 6052, 6053, and 6054. Therefore the PPI line 505 forms an electrical connection among the connections 6051, 6052, 6053, and 6054, which further connect the contact pads 102, 202, 302, and 402 respectively.

A second polymer layer 506 may be further formed on top of the PPI line 505. The second polymer layer 506 may be patterned to form openings where the solder balls 508 will be placed. The openings of the second polymer layer 506 may not be directly over the openings of the first polymer layer 504. An under bump metal (UBM) layer 507 may be formed around the openings of the second polymer layer 506. There may be multiple sub-layers for the UBM layer 507. The solder balls 508 may be mounted on the UBM layer 507 in each opening of the second polymer layer 506. The carrier 501 is removed after the four chips 101, 201, 301, and 401 have been packaged and connected to solder balls 508.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a first chip made of a first technology having a first contact pad, the first chip having a first passivation layer over a top surface of the first chip and the first contact pad, the first passivation layer having a bottom surface in contact with the top surface of the first chip and the first contact pad, and having a top surface opposite the bottom surface of the first passivation layer, wherein a first opening in the first passivation layer exposes the first contact pad;
    a second chip made of a second technology different from the first technology having a second contact pad, the second chip having a second passivation layer over a top surface of the second chip and the second contact pad, the second passivation layer having a bottom surface in contact with the top surface of the second chip and the second contact pad, and having a top surface opposite the bottom surface of the passivation layer, wherein a second opening in the second passivation layer exposes the second contact pad;
    a molding material encapsulating the first chip and the second chip, the molding material extending over the top surface of the first passivation layer and over the top surface of the second passivation layer;
    a first connection mounted on, and aligned directly over, the first contact pad;
    a second connection mounted on, and aligned directly over, the second contact pad;
    an insulating layer formed over the molding material and over the first and second connections, the insulating layer having openings exposing the first and second connections; and
    a post passivation interconnect (PPI) line on the insulating layer connected to the first contact pad by the first connection and connected to the second contact pad by the second connection;
    wherein the first connection is of a first connection mechanism type and the second connection is of a second connection mechanism type different from the first connection mechanism type, both connection mechanism types selected from a group consisting essentially of a conductive ball, a conductive via, or a conductive stud.

2. The device of claim 1, wherein the first technology is selected from a group consisting essentially of a CMOS chip, a GaAs chip, a SiGe chip, and an integrated passive device (IPD).

3. The device of claim 1, wherein the first chip is selected from a group consisting essentially of a CMOS processor chip, a GaAs optoelectronic device, a SiGe BiCMOS analog/digital converter, and an IPD comprising a plurality of resistors, inductors, and capacitors.

4. The device of claim 1, wherein the first connection connecting the PPI line and the first contact pad is a Cu ball having a height larger than about 30 um and a width larger than about 70 um.

5. The device of claim 1, wherein the first connection connecting the PPI line and the first contact pad is a Cu via having a height larger than about 10 um and a width larger than about 30 um.

6. The device of claim 1, wherein the first connection connecting the PPI line and the first contact pad is a Cu stud having a height about 10 um to 20 um and a width larger than about 50 um.

7. The device of claim 1, further comprising an under bump metal (UBM) layer in contact with the PPI line, formed on an opening of a polymer layer over the PPI line.

8. The device of claim 7, wherein the UBM layer comprises a material selected from a group consisting essentially of copper, silver, chromium, nickel, tin, gold, and combinations thereof.

9. The device of claim 1, further comprising a polymer layer between the molding material and the PPI line.

10. The device of claim 1, further comprising a passivation layer covering a portion of the first contact pad and on a surface of the first chip, and encapsulated within the molding material.

11. The device of claim 1, wherein the PPI line comprises a copper material.

12. The device of claim 1, wherein the molding material comprises an epoxy molding compound.

13. The device of claim 1, wherein the first contact pad comprises a material selected from a group consisting essentially of aluminum (Al), copper (Cu), tin (Sn), nickel (Ni), gold (Au), silver (Ag), or other electrically conductive material.

14. A device comprising:
    a first chip made of a first technology having a first contact pad, with a first passivation layer above the first contact pad having an opening to expose the first contact pad;
    a second chip made of a second technology different from the first technology having a second contact pad, with a second passivation layer above the second contact pad having an opening to expose the second contact pad;
    a first connection aligned directly over and mounted on the first contact pad and a second connection aligned directly over and mounted on the second contact pad, wherein the first connection is of a first connection mechanism type and the second connection is of a second connection mechanism type different from the first connection mechanism type, both connection mechanism types selected from a group consisting essentially of a conductive ball, a conductive via, or a conductive stud;
    a molding material encapsulating the first chip and the second chip together, while exposing the first connection and the second connection;
    a polymer layer on the molding material with a first opening to expose the first connection and a second opening to expose the second connection; and
    a post passivation interconnect (PPI) line on the polymer layer connected to the first connection in the first opening and connected to the second connection in the second opening.

15. A device comprising:
    a first chip made of a first technology having a plurality of first contact pads, with a first passivation layer above the plurality of first contact pads having openings exposing respective ones of the plurality of first contact pads;
    a second chip made of a second technology different from the first technology having a plurality of second contact pads greater in number than the plurality of first contact pads, with a second passivation layer above the plurality of second contact pads having openings exposing respective ones of the plurality of second contact pads;
    a plurality of first connections each mounted on, and aligned directly over, respective ones of the plurality of first contact pads and a plurality of second connections each mounted on, and aligned directly over, respective ones of the plurality of second contact pads, wherein each of the plurality of first connections is of a first connection mechanism type and each of the plurality of second connections is of a second connection mechanism type, the first connection mechanism type different from the second connection mechanism type, both connection mechanism types selected from a group consisting essentially of a conductive ball, a conductive via, or a conductive stud;

a molding material encapsulating the first chip and the second chip together, a top surface of the molding material substantially planar with and exposing top surfaces of each of the plurality of first connections and each of the plurality of the second connections;

a first polymer layer on the molding material with first openings exposing each of the plurality of first connections and second opening exposing each of the plurality of second connections; and a plurality of post passivation interconnect (PPI) lines on the first polymer layer connected to the plurality of first connections the plurality of second connections.

16. The device of claim 15, further comprising:

a second polymer layer over the plurality of PPI lines, the second polymer layer having a plurality of openings exposing a portion of the plurality of PPI lines;

a plurality of under bump metal (UBM) elements each disposed in the plurality of openings in the second polymer layer and contacting the plurality of PPI lines; and a plurality of connectors each disposed on respective ones of the UBM elements.

17. The device of claim 15, wherein the plurality of first connections each have a different shape than a shape of each of the plurality of second connections.

18. The device of claim 15, wherein the first technology is selected from a group consisting essentially of a CMOS chip, a GaAs chip, a SiGe chip, and an integrated passive device (IPD).

19. The device of claim 15, wherein the first chip is selected from a group consisting essentially of a CMOS processor chip, a GaAs optoelectronic device, a SiGe BiCMOS analog/digital converter, and an IPD comprising a plurality of resistors, inductors, and capacitors.

20. The device of claim 15, the first chip having a first height at the plurality of first contact pads different from a second height of the second chip at the plurality of second contact pads.

* * * * *